(12) United States Patent
Shin et al.

(10) Patent No.: US 12,326,754 B2
(45) Date of Patent: Jun. 10, 2025

(54) DIGITIZER AND DISPLAY APPARATUS INCLUDING THE SAME

(71) Applicant: Samsung Display Co., Ltd., Yongin-si (KR)

(72) Inventors: Jaiku Shin, Yongin-si (KR); Dongjin Park, Yongin-si (KR); Dongwoo Seo, Yongin-si (KR); Sungchul Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/173,672

(22) Filed: Feb. 11, 2021

(65) Prior Publication Data

US 2022/0011889 A1   Jan. 13, 2022

(30) Foreign Application Priority Data

Jul. 10, 2020   (KR) .................. 10-2020-0085672

(51) Int. Cl.
| | |
|---|---|
| *G06F 3/041* | (2006.01) |
| *G06F 1/16* | (2006.01) |
| *H10K 50/86* | (2023.01) |
| *H10K 50/87* | (2023.01) |
| *H10K 59/12* | (2023.01) |
| *H10K 59/40* | (2023.01) |
| *H10K 59/80* | (2023.01) |

(Continued)

(52) U.S. Cl.
CPC ............ *G06F 1/1616* (2013.01); *G06F 3/041* (2013.01); *H10K 50/86* (2023.02); *H10K 50/87* (2023.02); *H10K 59/12* (2023.02); *H10K 59/40* (2023.02); *H10K 59/8791* (2023.02); *H10K 59/8794* (2023.02); *H10K 77/111* (2023.02); *G06F 2203/04102* (2013.01); *H10K 59/131* (2023.02); *H10K 59/875* (2023.02); *H10K 2102/311* (2023.02)

(58) Field of Classification Search
CPC ..................... G06F 3/041; G06F 3/044; G06F 2203/04103; G06F 3/0412; G06F 3/0446; G06F 3/04883; G06F 2203/04105; G06F 3/017

See application file for complete search history.

(56) References Cited

U.S. PATENT DOCUMENTS

| | | | | |
|---|---|---|---|---|
| 5,745,197 A | * | 4/1998 | Leung | ................ G02F 1/13471 348/E13.058 |
| 8,045,129 B2 | * | 10/2011 | Kang | ................ G02F 1/13338 349/49 |

(Continued)

FOREIGN PATENT DOCUMENTS

| | | | | |
|---|---|---|---|---|
| JP | 2020/0045075 A | * | 6/2020 | ............. G06F 3/041 |
| KR | 10-2016-0150179 | | 12/2016 | |

(Continued)

OTHER PUBLICATIONS

Extended European search report for European Patent Application or Patent No. 21179524.0 dated Nov. 24, 2021.

*Primary Examiner* — Olga V Merkoulova

(74) *Attorney, Agent, or Firm* — KILE PARK REED & HOUTTEMAN PLLC

(57) ABSTRACT

A digitizer and a display apparatus including the same are provided. The digitizer includes a base layer in which a metal pattern is disposed, and a blocking layer disposed on the base layer.

34 Claims, 11 Drawing Sheets

(51) Int. Cl.
*H10K 77/10* (2023.01)
*H10K 59/131* (2023.01)
*H10K 102/00* (2023.01)

(56) References Cited

U.S. PATENT DOCUMENTS

| | | | | |
|---|---|---|---|---|
| 9,052,443 | B2* | 6/2015 | Park | G02B 7/00 |
| 9,134,859 | B2* | 9/2015 | Jeon | G06F 3/0412 |
| 9,678,604 | B2 | 6/2017 | Lee | |
| 10,120,503 | B2* | 11/2018 | Suzuki | G09G 3/3648 |
| 10,209,846 | B2* | 2/2019 | Wang | G02F 1/133512 |
| 10,474,266 | B2 | 11/2019 | Chae et al. | |
| 10,756,307 | B2 | 8/2020 | Park et al. | |
| 2010/0013785 | A1* | 1/2010 | Murai | G06F 3/04146 |
| | | | | 345/173 |
| 2012/0133624 | A1* | 5/2012 | Castagner | H01L 27/14678 |
| | | | | 345/207 |
| 2012/0223905 | A1* | 9/2012 | Jeon | G06F 3/044 |
| | | | | 345/173 |
| 2014/0184560 | A1* | 7/2014 | Adachi | G06F 3/0445 |
| | | | | 345/174 |
| 2015/0068790 | A1* | 3/2015 | Kim | H05K 1/0274 |
| | | | | 174/253 |
| 2015/0193044 | A1* | 7/2015 | Kim | G06F 3/0445 |
| | | | | 345/174 |
| 2016/0062516 | A1* | 3/2016 | Jeong | G06F 1/1643 |
| | | | | 345/174 |
| 2016/0092030 | A1* | 3/2016 | Byun | G02B 6/0031 |
| | | | | 345/175 |
| 2016/0106012 | A1* | 4/2016 | Jang | H05K 9/0086 |
| | | | | 361/679.55 |
| 2016/0236975 | A1* | 8/2016 | Sugimoto | C03C 15/00 |
| 2017/0075473 | A1* | 3/2017 | Kwon | B29C 59/16 |
| 2017/0315671 | A1* | 11/2017 | Suzuki | G06F 3/041662 |
| 2018/0067590 | A1* | 3/2018 | Wang | G06F 3/046 |
| 2018/0239478 | A1* | 8/2018 | Chae | G06F 3/041 |
| 2018/0366685 | A1* | 12/2018 | Park | B29D 11/0073 |
| 2019/0004357 | A1* | 1/2019 | Morinaga | G02F 1/13439 |
| 2019/0033636 | A1* | 1/2019 | Morinaga | G02F 1/13394 |
| 2019/0043928 | A1* | 2/2019 | Hong | H01L 27/323 |
| 2019/0064957 | A1* | 2/2019 | Wang | G06F 3/04164 |
| 2019/0131374 | A1* | 5/2019 | Kishimoto | H10K 50/844 |
| 2019/0163003 | A1* | 5/2019 | Kim | G02F 1/133305 |

FOREIGN PATENT DOCUMENTS

| | | |
|---|---|---|
| KR | 10-1750564 | 6/2017 |
| KR | 10-2018-0095174 | 8/2018 |
| KR | 10-2018-0138235 | 12/2018 |
| KR | 10-2019-0020495 | 3/2019 |
| KR | 10-2019-0021738 | 3/2019 |
| WO | 2020/122043 | 6/2020 |

* cited by examiner

39: 33

DIGITIZER AND DISPLAY APPARATUS INCLUDING THE SAME

CROSS-REFERENCE TO RELATED APPLICATION(S)

This application claims priority to and benefits of Korean Patent Application No. 10-2020-0085672 under 35 U.S.C. § 119, filed on Jul. 10, 2020 in the Korean Intellectual Property Office, the entire contents of which are incorporated herein by reference.

BACKGROUND

1. Technical Field

One or more embodiments relate to a digitizer and a display apparatus including the same.

2. Description of the Related Art

Electronic devices providing mobility have come into widespread use. For example, tablet personal computers (PCs), in addition to small-sized electronic devices such as mobile phones, have been widely used as mobile electronic devices.

In order to support various functions, mobile electronic devices include a display apparatus for providing a user with visual information such as images or videos. Recently, as components for driving such display apparatuses have been miniaturized, the proportion occupied by display apparatuses in electronic devices is gradually increasing. Moreover, a structure that may be curved to have a preset angle from a flat state has been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In the case where a display apparatus includes a digitizer that may receive an external signal, a pattern layer of the digitizer may be viewed. An image displayed on the display panel may not be accurately displayed and may be influenced by the pattern layer of the digitizer. One or more embodiments include a display apparatus in which a pattern layer of a digitizer may not be viewed and which may display a clear image.

Additional aspects will be set forth in part in the description which follows and, in part, will be apparent from the description, or may be learned by practice of the presented embodiments of the disclosure.

According to one or more embodiments, a digitizer may include a base layer in which a metal pattern is disposed, and a blocking layer disposed on the base layer.

The blocking layer may be black.

The digitizer may further include a base planarization layer disposed between the blocking layer and the base layer.

The blocking layer and the base layer may be integral with each other.

The base layer may include a body layer, and a pattern layer disposed on the body layer.

A side of the blocking layer may be substantially flat.

The digitizer may further include a heat-dissipating plate extended to the base layer.

The heat-dissipating plate may be bendable.

According to one or more embodiments, a display apparatus may include a display panel including a first surface on which a display area is disposed, and a second surface, and a digitizer disposed on the second surface of the display panel, wherein the digitizer may include a base layer, and a blocking layer disposed on the base layer. The blocking layer may face the second surface.

The blocking layer may include at least one of polyimide and a black filler.

The digitizer may include a base planarization layer disposed between the base layer and the blocking layer.

The base layer may include a body layer, and a pattern layer disposed on the body layer. The blocking layer may be disposed on the pattern layer.

The base layer may include an adhesive layer disposed between the pattern layer and the blocking layer.

The display apparatus may further include an optical functional layer disposed on the first surface.

The display apparatus may further include a heat-dissipating plate extended to the digitizer.

The heat-dissipating plate may be bendable.

The heat-dissipating plate may include a first heat-dissipating plate extended to the digitizer, and a second heat-dissipating plate extended to the first heat-dissipating plate.

The display panel may be flexible.

A side of the digitizer facing the second surface may be substantially flat.

According to one or more embodiments, a display apparatus may include a display panel including a first surface on which a display area is disposed and a second surface, a panel-protecting member disposed on the second surface, and a digitizer disposed on the panel-protecting member.

The display apparatus may further include an optical functional layer disposed on the first surface.

The display apparatus may further include a cover member disposed on the first surface.

The digitizer may include a base layer, and a blocking layer disposed on the base layer and facing the second surface.

The blocking layer may include at least one of polyimide and a black filler.

The digitizer may include a base planarization layer disposed between the base layer and the blocking layer.

The base layer may include a body layer, and a pattern layer disposed on the body layer. The blocking layer may be disposed on the pattern layer.

The base layer may include an adhesive layer disposed between the pattern layer and the blocking layer.

The display apparatus may further include a heat-dissipating plate extended to the digitizer.

The heat-dissipating plate may be bendable.

The heat-dissipating plate may include a first heat-dissipating plate extended to the digitizer, and a second heat-dissipating plate extended to the first heat-dissipating plate.

The display panel may be flexible.

One side of the digitizer facing the second surface may be substantially flat.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
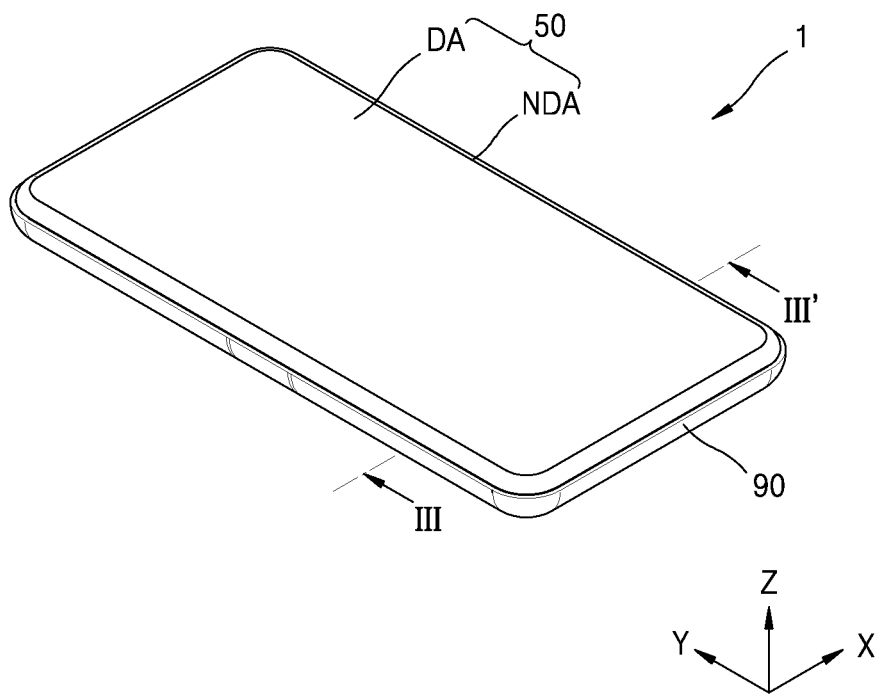
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

Because the disclosure may have diverse modified embodiments, illustrative embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

An expression used in the singular may encompass the expression of the plural, unless the context clearly indicates otherwise.

It will be further understood that terms such as "comprises", "has", and "includes" specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. For example, for example, intervening layers, regions, or elements may be present.

Sizes of elements in the drawings may be exaggerated for convenience of explanation. In other words, because sizes and thicknesses of components in the drawings may be arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

The term overlap may include layer, stack, face or facing, extending over, extending under, covering or partly covering or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
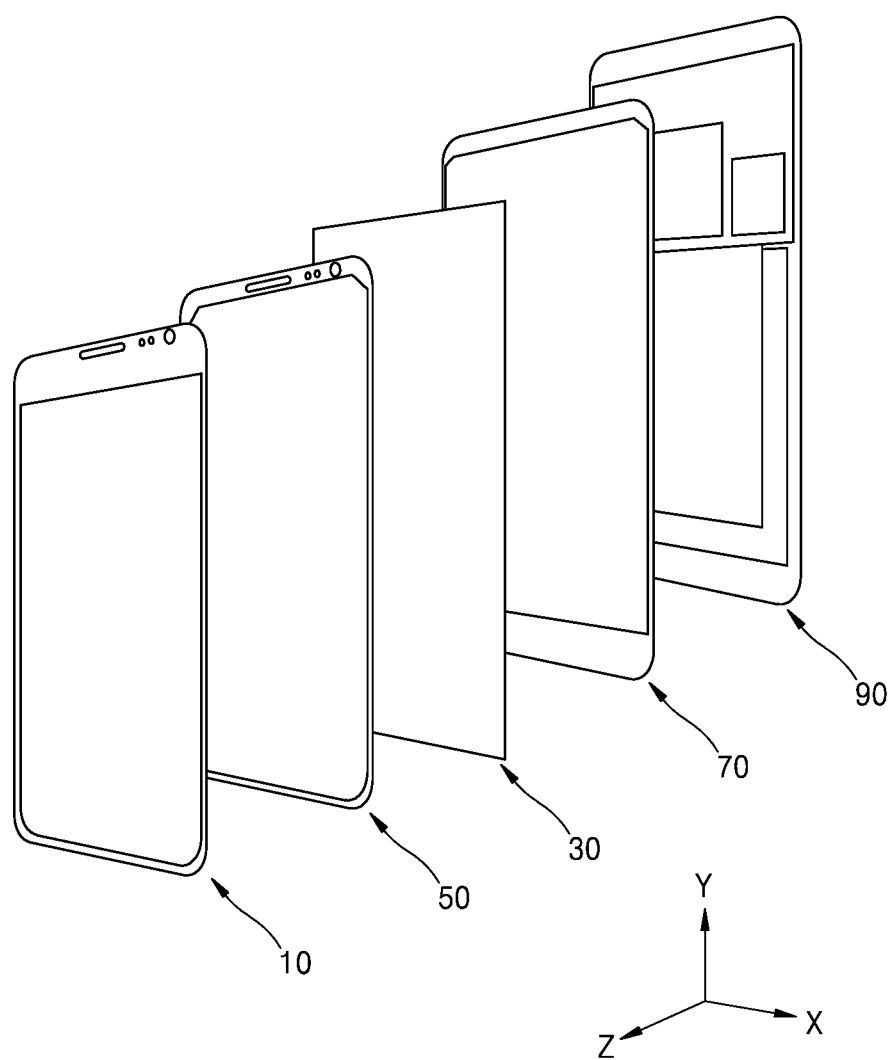
FIG. 2 is an exploded schematic perspective view of the display apparatus shown in FIG. 1.
Figure 3:
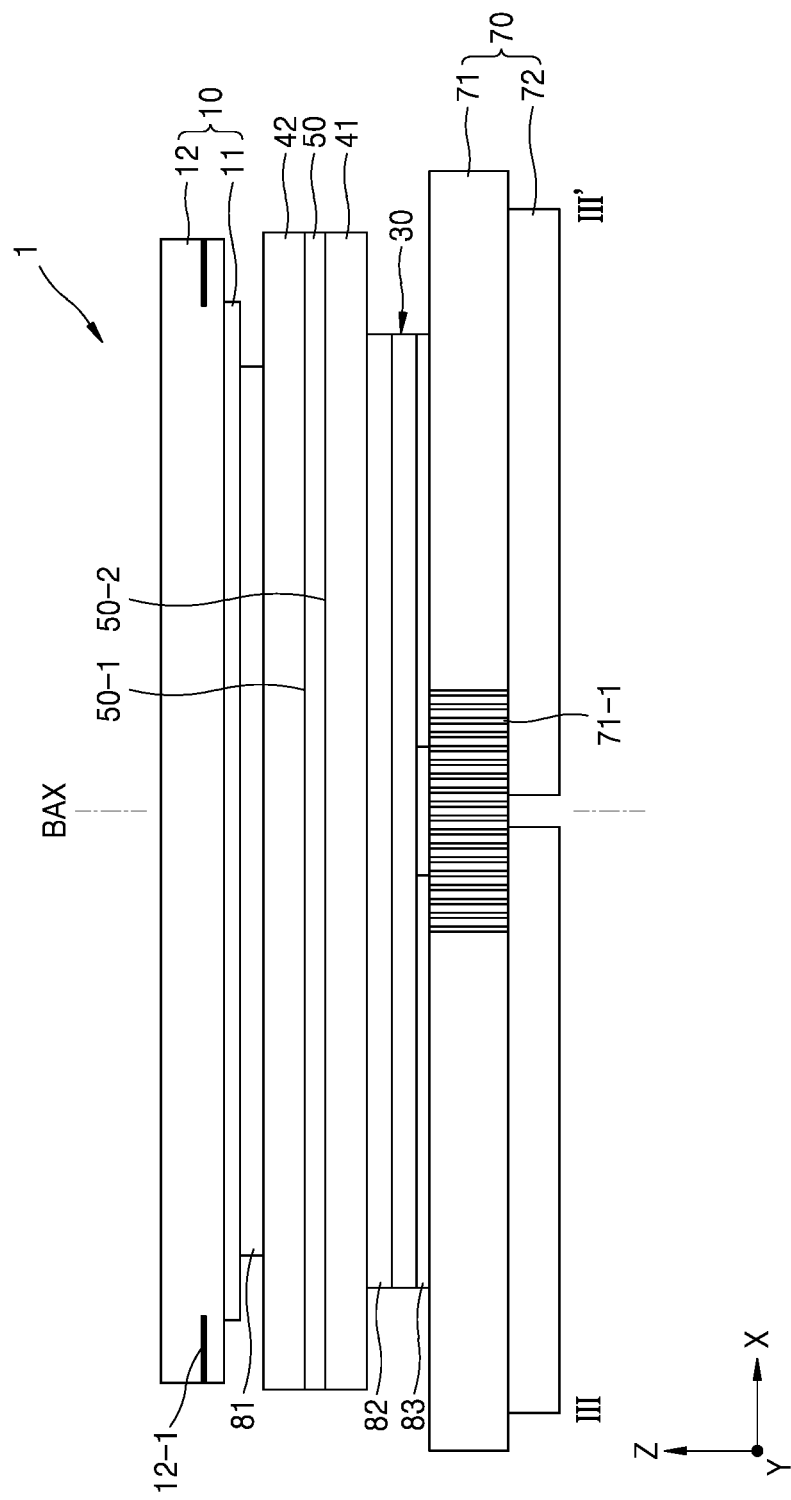
FIG. 3 is a schematic cross-sectional view of the display apparatus, taken along line III-III' of FIG. 1.

FIG. 1 is a schematic perspective view of a display apparatus 1 according to an embodiment. FIG. 2 is an exploded schematic perspective view of the display apparatus 1 shown in FIG. 1. FIG. 3 is a schematic cross-sectional view of the display apparatus 1, taken along line III-III' of FIG. 1.

Referring to FIGS. 1 to 3, the display apparatus 1 may include an apparatus for displaying moving images or still images and may be used as a display screen for various products including televisions, laptops, monitors, advertisement boards, Internet of things (IOT) devices, as well as portable electronic apparatuses including mobile phones, smart phones, tablet personal computers (PCs), mobile communication terminals, electronic organizers, electronic books, portable multimedia players (PMPs), navigation apparatuses, and ultramobile personal computers (UMPCs). The display apparatus 1 may be used in wearable devices including smartwatches, watchphones, glasses-type displays, and head-mounted displays (HMDs). The display apparatus 1 may be used as instrument panels for automobiles, center fasciae for automobiles, or center information displays (CIDs) arranged on a dashboard, room mirror displays that replace side mirrors of automobiles, and displays arranged on the backsides of front seats as entertainment for back seats of automobiles. FIGS. 1 and 2 show an example in which the display apparatus 1 is used as a smartphone, for convenience of description.

The display apparatus 1 may include a cover member 10, a display panel 50, a display circuit board 51 (refer to FIG. 4A), a digitizer 30, a heat-dissipating plate 70, a display driver 52, a touch sensor driver 53, a main circuit board (not shown), a battery, and a bottom cover 90.

Herein, a "top portion" may refer to a direction in which the cover member 10 is arranged with respect to the display panel 50, for example, a (+) z-direction, and a "bottom portion" may refer to a direction in which the bottom cover 90 is arranged with respect to the display panel 50, for example, a (−) z-direction. "Left", "right", "top", and "bottom" respectively may refer to directions in a plan view of the display panel 50. As an example, "left" may refer to a (−) x-direction, "right" may refer to a (+) x-direction, "top" may refer to a (+) y-direction, and "bottom" may refer to a (−) y-direction.

The display apparatus 1 may have a rectangular shape in a plan view. As an example, as shown in FIG. 1, the display apparatus 1 may have a rectangular planar shape having short sides in a first direction (the x-direction) and long sides in a second direction (the y-direction). An edge where the short side of the first direction (the x-direction) meets the long side of the second direction (the y-direction) may be rounded to have a preset curvature or formed to have a right angle. The planar shape of the display apparatus 1 is not limited to a rectangle and may have other polygonal, elliptical, or atypical shapes.

The display apparatus 1 may have various shapes. As an example, the display apparatus 1 may have an invariable shape. In another embodiment, at least a portion of the display apparatus 1 may be folded. The display apparatus 1 may have an in-folding shape in which display areas of the display panel 50 are folded to face each other in case that the display apparatus 1 is folded, or may have an out-folding shape in which the display areas of the display panel 50 are exposed to the outside in case that the display apparatus 1 is folded. Hereinafter, for convenience of description, the case where the display apparatus 1 has an in-folding shape will be described in detail.

The display apparatus 1 may be folded around a bending axis BAX. In case that the display apparatus 1 is folded around the bending axis BAX, the size of the display apparatus 1 may be reduced. In case that the display apparatus 1 is unfolded, the display apparatus may display images while the display areas may form a flat surface, thereby providing a large screen.

The cover member 10 may be arranged on the display panel 50 to cover the top surface of the display panel 50. Accordingly, the cover member 10 may protect the top surface of the display panel 50.

The cover member 10 may include a transmissive cover portion DA50 and a light-blocking cover portion NDA50, the transmissive cover portion DA50 may correspond to the display panel 50, and the light-blocking cover portion NDA50 may correspond to a portion excluding the display panel 50. The light-blocking cover portion NDA50 may include an opaque material that blocks light. The light-blocking cover portion NDA50 may include a pattern that may be viewed to a user in the case where images are not displayed.

The cover member 10 may include a cover window 11 and a protective member 12. The cover window 11 may include a transparent material. The cover window 11 may include at least one of glass, a synthetic resin made of a transparent material, etc. The cover window 11 may include at least one layer. The protective member 12 may be arranged on the top surface of the cover window 11 to prevent force from being applied to the cover window 11 or prevent scratches from occurring on the cover window 11. An opaque layer 12-1 may be arranged on a portion of the protective member 12, particularly, in an edge portion of the protective member 12. The opaque layer 12-1 may block light and include a light-blocking layer to be described below.

The display panel 50 may be arranged below the cover member 10. The display panel 50 may overlap the transmissive cover portion DA50 of the cover member 10. The display panel 50 may include a first surface 50-1 and a second surface 50-2, the display area may be arranged in the first surface 50-1, and the second surface 50-2 may be opposite to the display area.

The display panel 50 may include the display area DA and a peripheral area NDA. The display area DA may include a portion in which images are displayed, and the peripheral area NDA may include a portion in which images are not displayed.

The display panel 50 may include a light-emitting display panel including a light-emitting element. As an example, the display panel 50 may include an organic light-emitting display panel that uses an organic light-emitting diode including an organic emission layer, an ultra-miniaturized light-emitting diode display panel that uses a micro light-emitting diode (LED), a quantum-dot light-emitting display panel that uses a quantum-dot light-emitting diode including a quantum-dot emission layer, and an inorganic light-emitting display panel that uses an inorganic light-emitting diode including an inorganic semiconductor.

The display panel 50 may include a rigid display panel which has rigidity and is not easily broken or a flexible display panel which has flexibility and is easily bendable, foldable, or rollable. As an example, the display panel 50 may include a foldable display panel, a curved display panel having a curved display surface, a bended display panel having a bendable portion excluding a display surface, a rollable display panel, and a stretchable display panel.

The display panel 50 may include a transparent display panel which is transparent such that an object or background arranged on the bottom surface of the display panel 50 may be viewed through the top surface of the display panel 50. In another embodiment, the display panel 50 may include a reflective display panel which may reflect an object or background of the top surface of the display panel 50.

A first flexible film 54 may be attached to the edge of one side of the display panel 50. One side of the first flexible film 54 may be attached to the edge of one side of the display panel 50 by using an anisotropic conductive film. The first flexible film 54 may include a bendable flexible film.

A display driver 52 may be arranged on the first flexible film 54. The display driver 52 may receive control signals and power voltages and generate and output signals and voltages for driving the display panel 50. The display driver 52 may include an integrated circuit (IC).

The display circuit board 51 may be attached to another side of the first flexible film 54. The other side of the first flexible film 54 may be attached to the top surface of the display circuit board 51 by using an anisotropic conductive film. The display circuit board 51 may include a flexible printed circuit board (FPCB) that is bendable, a rigid printed circuit board (PCB) that is rigid and is not easily bent, or a composite printed circuit board including a rigid PCB and a FPCB.

The touch sensor driver 53 may be arranged on the display circuit board 51. The touch sensor driver 53 may include an IC. The touch sensor driver 53 may be attached to the display circuit board 51. The touch sensor driver 53 may be electrically connected to touch electrodes of a touchscreen layer of the display panel 50 through the display circuit board 51.

The touchscreen layer of the display panel 50 may sense a touch input of a user by using at least one of various touch methods including a resistive layer method and a capacitive method. As an example, in the case where the touchscreen layer of the display panel 50 senses a user's touch input by a capacitive method, the touch sensor driver 53 may determine whether the user touches the touchscreen layer by applying driving signals to driving electrodes among the touch electrodes and sensing voltages charged in a mutual capacitance between the driving electrodes and sensing electrodes among the touch electrodes through the sensing electrodes. The user's touch may include a contact touch and a proximity touch. The contact touch refers to direct contact of a user's finger or an object such as a pen on the cover member 10 arranged on the touchscreen layer. The proximity touch indicates that a user's finger or an object such as a pen is located adjacent to the cover member 10, such as while hovering thereover. The touch sensor driver 53 may transfer sensor data to a main processor according to sensed voltages, and the main processor may calculate a touch coordinate at which the touch input occurs by analyzing the sensor data.

An additional power supply may be arranged on the display circuit board 51, the power supply being configured to drive the pixels of the display panel 50, a scan driver, and the display driver 52. In another embodiment, the power supply may be integrated with the display driver 52. The display driver 52 and the power supply may be formed as an IC.

The display panel 50 may include a substrate 100, a display layer (not shown), the touchscreen layer, an optical functional layer 42, and a panel protecting member 41.

The substrate may include an insulating material such as glass, quartz, a polymer resin, or a combination thereof. The substrate 100 may include a rigid substrate or a flexible substrate which is bendable, foldable, and rollable. For example, the substrate 100 may include polymer resin such as polyethersulphone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate 100 may have a multi-layered structure including a layer that includes the polymer resin and an inorganic layer (not shown). As an example, the substrate 100 may include two layers including the polymer resin and an inorganic barrier layer therebetween.

The display layer may be arranged on the substrate 100. The display layer may include pixels and include a layer that displays images. The display layer may include a circuit layer, a display element layer, and a sealing member, the circuit layer including thin-film transistors, display elements being arranged in the display element layer, and the sealing member sealing the display element layer.

The display layer may be divided into the display area DA and a peripheral area DPA. The display area DA may be a portion that includes pixels arranged therein and may display an image. The peripheral area DPA may be a portion that is outside the display area DA and may not display an image. The peripheral area DPA may be arranged to surround the display area DA. The peripheral area DPA may include a portion from the outside of the display area DA to the edge of the display panel 50. Not only pixels but also pixel circuits, scan lines, data lines, power wirings, etc. may be arranged in the display area DA, the pixel circuits may drive the pixels, and the scan lines, the data lines, and the power lines may be connected to the pixel circuits. The scan driver and fan-out lines may be arranged in the peripheral area DPA, the scan driver may apply scan signals to the scan lines, and the fan-out lines may connect the data lines to the display driver.

The touchscreen layer may be arranged on the display layer. The touchscreen layer may include the touch electrodes and include a layer that may sense whether a user touches the touchscreen layer. The touchscreen layer may be directly formed on the sealing member of the display layer. In another embodiment, the touchscreen layer may be separately formed and coupled to the sealing member of the display layer through an adhesive layer such as an optically clear adhesive (OCA).

The optical functional layer 42 may be arranged on the touchscreen layer. The optical functional layer 42 may include an anti-reflection layer. The anti-reflection layer may reduce reflectivity of light (external light) incident toward the display apparatus 1 from the outside.

In an embodiment, the anti-reflection layer may include a polarization film. The polarization film may include a linear polarization plate and a phase delay film such as a quarter-wave ($\lambda/4$) plate. The phase delay film may be arranged on the touchscreen layer, and the linear polarization plate may be arranged on the phase delay film.

According to some embodiments, the anti-reflection layer may include a filter layer including a black matrix and color filters. The color filters may be arranged by taking into account colors of light emitted from the pixels of the display apparatus 1. For example, the filter layer may include a color filter of a red, green, or blue color.

According to some embodiments, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and thus the reflectivity of external light may be reduced.

The cover member 10 may be arranged on the optical functional layer 42. The cover member 10 may be attached to the optical functional film 42 through a transparent adhesive member such as an optically clear adhesive (OCA) film.

The panel protecting member 41 may be arranged on the bottom of the display panel 50. The panel protecting member 41 may be attached to the bottom of the display panel 50 through an adhesive member. The adhesive member may include a pressure sensitive adhesive (PSA). The panel protecting member 41 may include at least one of a light-absorbing layer for absorbing light incident from the outside, a cushion layer for absorbing an impact from the outside, and a heat-dissipating layer for efficiently dissipating heat of the display panel 50.

The light absorbing layer may be arranged on the bottom of the display panel 50. The light absorbing layer may block the transmission of light to prevent elements, for example, the display circuit board, etc. from being viewed above the display panel 50, and the elements may be arranged under a light absorbing member. The light absorbing layer may include a light-absorbing material such as black pigment, black dye, or a combination thereof.

The first flexible film 54 may be arranged in a portion of the peripheral area DPA on the edge of one side of the display panel 50. The first flexible film 54 may be bent below the display panel 50, and the display circuit board may be arranged on the bottom surface of the panel protecting member 41. The display circuit board may be attached and fixed to the bottom surface of the panel protecting member 41 through a separate adhesive member. The adhesive member may include a pressure sensitive adhesive (PSA).

The digitizer 30 may be arranged below the display panel 50. The digitizer 30 may sense a signal input from an external electronic pen, etc. by including a pattern layer. Particularly, the digitizer 30 may sense the intensity, the direction, and the like of a signal input from an electronic pen. The digitizer 30 may be electrically connected to the main circuit board.

A bracket (not shown) for supporting the display panel 50 may be arranged below the digitizer 30. The bracket may include plastic, metal or both plastic and metal.

The heat-dissipating plate 70 may be arranged on the bracket. The heat-dissipating plate 70 may be coupled to the bracket or provided as one body with the bracket. However, for convenience of description, a case where the bracket and the heat-dissipating plate 70 are integral with each other will be described below.

The heat-dissipating plate 70 may transfer heat generated from at least one of the display panel 50 and the digitizer 30 to the outside. The heat-dissipating plate 70 may include metal having an excellent heat transfer efficiency. The heat-dissipating plate 70 may include a first heat-dissipating plate 71 and a second heat-dissipating plate 72.

The first heat-dissipating plate 71 may be arranged on the backside of the digitizer 30. The first heat-dissipating plate 71 may have various structures depending on whether the display apparatus 1 is folded and the folding shape thereof. As an example, in the case where the display apparatus 1 is not folded, the first heat-dissipating plate 71 may have a plate shape that does not vary. As another example, in the case where the display apparatus 1 is folded, the first heat-dissipating plate 71 may include a folding structure 71-1. The shape of the folding structure 71-1 may vary or the length of the folding structure 71-1 may vary in case that the display apparatus 1 is folded. The folding structure 71-1 may include an uneven shape and links rotatably connected to each other. While the display apparatus 1 is folded, the folding structure 71-1 may be bent around the bending axis BAX. The folding structure 71-1 may be formed such that sides thereof are symmetric with respect to the bending axis BAX. A portion of the first heat-dissipating plate 71 excluding the folding structure 71-1 may have a plate shape having a flat surface.

The second heat-dissipating plate 72 may be arranged under the first heat-dissipating plate 71. The second heat-dissipating plate 72 may directly contact the first heat-dissipating plate 71 or be connected to the first heat-dissipating plate 71 through an adhesive having improved heat transfer efficiency. The second heat-dissipating plates 72 may be separated from each other. As an example, the second heat-dissipating plates 72 may be separated and apart from each other in a portion where the bending axis BAX is arranged. The second heat-dissipating plates 72 may not cause interference while the display apparatus 1 is folded.

The first heat-dissipating plate 71 and the second heat-dissipating plate 72 may include different materials. As an example, the first heat-dissipating plate 71 may include graphite nanotubes, carbon nanotubes, or a combination thereof, and the second heat-dissipating plate 72 may include a metal thin film such as copper, nickel, ferrite, silver, or a combination thereof, which may shield electromagnetic waves and have improved thermal conductivity.

The main circuit board and a battery (not shown) may be arranged below the bracket. The main circuit board may include a PCB or a FPCB.

The main circuit board may include a main processor (not shown), a camera apparatus (not shown), a main connector (not shown), and a component (not shown). The main processor may include an IC. The camera apparatus may be arranged on the top surface and the bottom surface of the main circuit board, and each of the main processor and the main connector may be arranged on the top surface or the bottom surface of the main circuit board.

The main processor may control all functions of the display apparatus 1. As an example, the main processor may output digital video data to the display driver through the display circuit board to allow the display panel 50 to display images. The main processor may receive sensing data from the touch sensor driver 53. The main processor may determine whether a user touches the touchscreen layer according to sensing data and perform an operation corresponding to a user's direct touch or proximity touch. As an example, the main processor may calculate a user's touch coordinates by analyzing sensing data and execute an application indicated by an icon touched by the user and perform an operation. The main processor may include an application processor including an IC, a central processing unit, or a system chip.

The camera apparatus may process an image frame such as a still image or a moving image obtained by an image sensor during a camera mode and outputs the image frame to the main processor. The camera apparatus may include at least one of a camera sensor (e.g. charge coupled device (CCD), complementary metal oxide semiconductor (CMOS), etc.), a photo sensor (or an image sensor), and a laser sensor. The camera apparatus may be connected to an image sensor of the component overlapping a component area to process an image input to the image sensor.

A cable passing through a cable hole of the bracket may be connected to the main connector. Accordingly, the main circuit board may be electrically connected to the display circuit board.

The main circuit board may further include at least one of wireless communication units, at least one of input units, at least one of sensor units, at least one of output units, at least one of interface units, a memory, and a power supply in addition to the main processor, the camera apparatus, and/or the main connector.

The wireless communication units may include at least one of a broadcast receiving module, a mobile communication module, a wireless Internet module, a short distance communication module, and a position information module.

The broadcast receiving module may receive broadcasting signals and/or broadcasting-related information from an external broadcasting management server through a broadcasting channel. The broadcasting channel may include satellite channels and ground wave channels.

The mobile communication module may transmit/receive a wireless signal to/from at least one of a base station, an external terminal, and a server in a mobile communication network established according to technology standards or communication schemes for mobile communication (e.g. Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A)). Examples of the wireless signal may include a voice call signal, a video call signal, and various types of data according to text/multimedia messages transception.

The wireless Internet module may refer to a module for wireless Internet access. The wireless Internet module may transmit or receive a wireless signal in a communication network based on wireless Internet technologies. The wireless Internet technologies may be, for example, a Wireless LAN (WLAN), Wireless-Fidelity (Wi-Fi), Wi-Fi Direct, and Digital Living Network Alliance (DLNA).

The short distance communication module may be provided for short range communication and may support short range communication by using at least one of Bluetooth™, Radio Frequency Identification (RFID), Infrared Data Association (IrDA), Ultra Wideband (UWB), ZigBee™, Near Field Communication (NFC), Wireless-Fidelity (Wi-Fi), Wi-Fi Direct, and Wireless Universal Serial Bus (USB). The short distance communication module may support wireless communication between the display apparatus 1 and a wireless communication system, between the display apparatus 1 and another electronic apparatus, or between the display apparatus 1 and a network where another electronic apparatus (or an external server) is located, through wireless area networks. The wireless area networks may include wireless personal area networks. The other electronic apparatus may include a wearable device that may exchange data (or cooperate) with the display apparatus 1

The position information module may be provided for obtaining the position of the display apparatus 1 and may include a global positioning system (GPS) module or wireless fidelity (Wi-Fi) module as representative examples. As an example, the display apparatus 1 may obtain the position of the display apparatus 1 based on signals sent from GPS satellites through a GPS module. The display apparatus 1 may obtain the position of the display apparatus 1 based on information of a wireless access point (AP) that receives or transmits a wireless signal to or from a Wi-Fi module through the Wi-Fi module. The position information module may be provided for obtaining the position (or the current position) of the display apparatus 1 and is not limited to a module that directly calculates or obtains the position of the display apparatus 1 or link data with that of the display apparatus.

The input unit may include an image receiving portion such as a camera device for receiving an image signal, a sound input portion such as a microphone for receiving a sound signal, and an input device for receiving information from a user.

The camera device may process an image frame of a still image or a moving image obtained by an image sensor during an image communication mode or a photographing mode. The processed image frame may be displayed on the display panel 50 or stored in the memory.

The microphone may process an external audio signal into electrical audio data. The processed audio data may be variously utilized according to a function or application performed by the display apparatus 1. Various noise removal algorithms for removing noise may be implemented in the microphone to remove noise generated while receiving the external audio signal.

The main processor may control the operation of the display apparatus 1 to correspond to information input through the input device. The input device may include a mechanical input means including a button, a dome switch, a jog wheel, a jog switch arranged on the backside or the lateral side of the display apparatus 1, or a touch input means. The touch input means may include the touchscreen layer of the display panel 50.

The sensor unit may include one or more sensors that sense at least one of information inside the display apparatus 1, peripheral environment information around the display apparatus 1, and user information, and generate a corresponding sensing signal. The main processor may drive the display apparatus 1 or control the operation of the display apparatus 1, or perform a data process, a function, or an operation related to an application installed in the display apparatus 1 based on the sensing signal. The sensor unit may include at least one of a proximity sensor, an illumination sensor, an acceleration sensor, a magnetic sensor, a gravity (G)-sensor, a gyroscope sensor, a motion sensor, an RGB sensor, an infrared (IR) sensor, a finger scan sensor, an ultrasonic sensor, an optical sensor, a battery gauge, an environment sensor (e.g., a barometer, a hygrometer, a thermometer, a radiation sensor, a heat sensor, and a gas sensor), and a chemical sensor (e.g., an electronic nose, a healthcare sensor, and a biometric sensor).

The proximity sensor may refer to a sensor that senses the existence of an object that approaches a sensing surface or exists near the sensing surface without mechanical contact, by using an electromagnetic force or IR rays. Examples of the proximity sensor include a transmission-type photoelectric sensor, a direct reflection-type photoelectric sensor, a mirror reflection-type photoelectric sensor, a high frequency oscillation-type proximity sensor, a capacity-type proximity sensor, a magnetic proximity sensor, and an IR-type proximity sensor. The proximity sensor may not only sense a proximity touch operation but also may sense a proximity touch pattern such as a proximity touch distance, a proximity touch direction, a proximity touch speed, a proximity touch time, a proximity touch location, or a proximity touch moving state. The main processor may process data (or information) corresponding to a proximity touch operation and a proximity touch pattern sensed through a proximity sensor, and control to display visual information corresponding to the processed data on the display panel 50.

The ultrasonic sensor may recognize location information of an object by using ultrasonic waves. The main processor may calculate the location of an object through information sensed by an optical sensor and ultrasonic sensors. Since the velocity of light is different from the velocity of ultrasonic waves, the location of an object may be calculated by using duration during which light reaches an optical sensor and duration during which ultrasonic waves reach an ultrasonic sensor.

The output unit may be provided for generating an output related to visual, auditory, or tactile sense and may include at least one of the display panel 50, a sound output unit, a haptic module, and a light output unit.

As an example, the display panel 50 may output or display information processed by the display apparatus 1. As an example, the display panel 50 may display execution screen information of an application driven in the display apparatus 1 or user interface (UI) and graphic user interface (GUI) information corresponding to the execution screen information. The display panel 50 may include the display layer and the touchscreen layer, the display layer may display images, and the touchscreen layer may sense a user's touch input. Accordingly, the display panel 50 may serve as an input unit that provides an input interface between the display apparatus 1 and a user and simultaneously, serves as an output unit that provides an output interface between the display apparatus 1 and a user.

The sound output unit may output sound data received by the wireless communication unit during a call signal reception mode, a communication mode or a recording mode, a voice recognition mode, a broadcasting reception mode, etc. or sound data stored in the memory. The sound output unit may output a sound signal related to a function (e.g. a call signal reception sound, a message reception sound, etc.) performed by the display apparatus 1. The sound output unit may include a receiver and a speaker. At least one of the receiver and the speaker may include a sound generator attached on the bottom of the display panel 50 and outputting a sound by vibrating the display panel 50. The sound generator may include a piezoelectric element contracting or expanding according to an electric signal, a piezoelectric actuator, or an exciter that vibrates the display panel 50 by generating magnetic force using a voice coil.

The haptic module may generate various tactile effects that may be felt by a user. The haptic module may provide vibration as a tactile effect to a user. The intensity or pattern, etc. of vibration generated by the haptic module may be controlled by a user's selection or setting of the main processor. As an example, the haptic module may synthesize different vibrations to output the same or sequentially output the same. The haptic module may generate various tactile effects including a pin arrangement that vertically moves with respect to a skin surface that is touched, spraying force or suctioning force of air through a spraying hole or an suctioning hole, brushing on a skin surface, a contact of an electrode, an effect by stimuli such as electromagnetic force, and an effect by reproducing cool and warm feeling through an element that may absorb heat or emit heat in addition to vibration. The haptic module may not only transfer a tactile effect through a direct contact but also be implemented to allow a user to feel a tactile effect through senses (e.g., muscular) of, e.g., fingers or arms.

The light output unit may output a signal informing of the occurrence of an event by using light of a light source. Examples of an event occurring at the display apparatus 1 may include message reception, call signal reception, missed calls, alarms, schedule reminders, e-mail reception, and information reception using an application. A signal output by the optical output unit may be implemented in case that the display apparatus 1 emits light having a single color or multiple colors to the front or back. Signal output may be ended in case that the display apparatus 1 senses that a user recognizes an event.

The interface unit may serve as a path for various kinds of external apparatuses connected to the display apparatus 1. The interface unit may include at least one of a wired/wireless headset port, an external charging port, a wired/wireless data port, a memory card port, a port for connecting to an apparatus including an identification module, an audio input/output (I/O) port, a video I/O port, and an earphone port. The display apparatus 1 may perform a proper control related to a connected external apparatus in case that the external apparatus is connected to the interface unit.

The memory may store data that supports various functions of the display apparatus 1. The memory may store application programs driven by the display apparatus 1, pieces of data for operations of the display apparatus 1, and instructions. At least some of the application programs may be downloaded from an external server through wireless communication. The memory may store an application for operations of the main processor and temporarily store input/output data, for example, data such as phone books, messages, still images, and moving images. The memory may store haptic data for various patterns of variations provided to the haptic module 752 and sound data regarding various sounds provided to the sound output unit. The memory may include at least one type of storage medium among a flash memory type memory, a hard disk type memory, a solid state disk type memory, a silicon disk drive type memory, a multimedia card micro type memory, a card type memory (e.g. secure digital (SD) memory, or extreme digital (XD) memory), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk.

The power supply may receive external power and internal power and may supply power to respective elements included in the display apparatus 1 under the control of the main processor. The power supply may include the battery. The power supply may include a connection port. The connection port may be provided as an example of an interface portion to which an external charger is electrically connected, the external charger supplying power to charge the battery. In another embodiment, the power supply may wirelessly charge the battery without using the connection port. The battery may receive power from an external wireless power transmitter by using at least one of an inductive coupling method based on magnetic induction or a magnetic resonance coupling method based on electromagnetic resonance. The battery may be arranged not to overlap the main circuit board in a third direction (a z-direction). The battery may overlap a battery hole of the bracket.

The bottom cover 90 may be arranged below the main circuit board and the battery. The bottom cover 90 may be fastened and fixed to the bracket. The bottom cover 90 may form the exterior of the bottom of the display apparatus 1. The bottom cover 90 may include plastic, metal, or both plastic and metal.

The display apparatus 1 may include an adhesive layer. As an example, a first adhesive layer 81 may be arranged between the cover member 10 and the optical functional layer 42. A second adhesive layer 82 may be arranged between the panel protective member 12 and the digitizer 30. A third adhesive layer 83 may be arranged between the digitizer 30 and the heat-dissipating plate 70. The third adhesive layers 83 may be separated and arranged to be apart from each other. The bending axis BAX may be arranged in a portion in which the third adhesive layers 83 are separated or a portion in which the third adhesive layers 83 are not arranged. Since the third adhesive layer 83 may not be arranged in the portion of the bending axis BAX, the third adhesive layer 83 may not hinder folding or unfolding of the display apparatus 1 while the display apparatus 1 is folded.

Figure 4A:
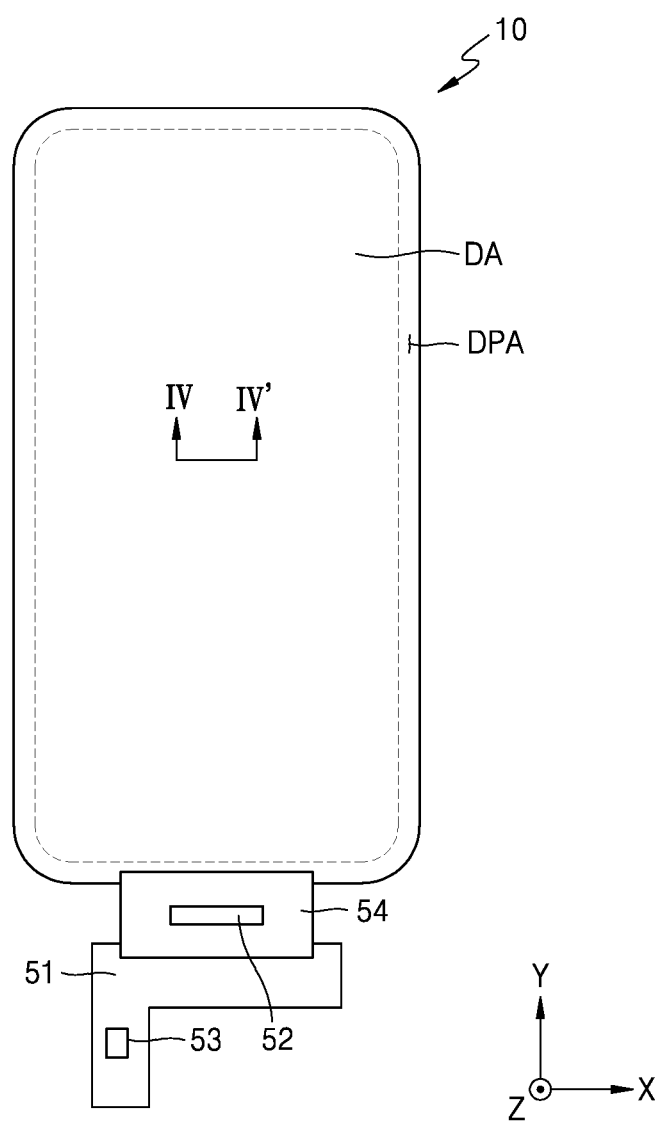
FIG. 4A is a schematic plan view of a display panel shown in FIG. 2.
Figure 4B:
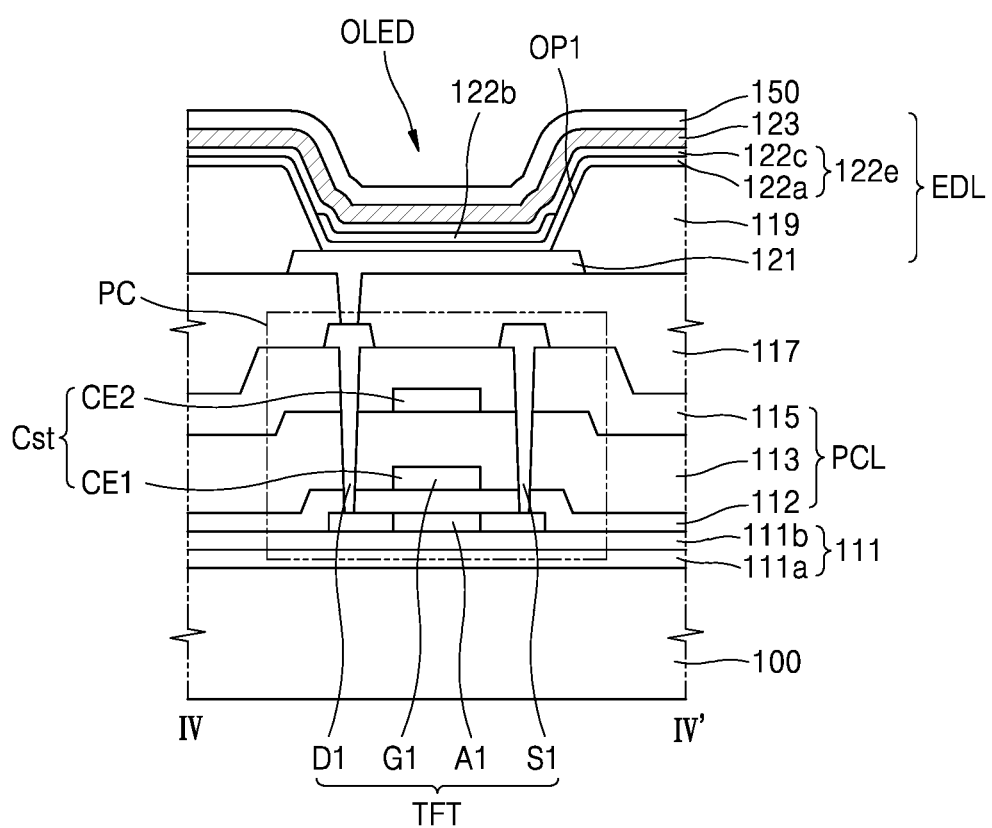
FIG. 4B is a schematic cross-sectional view of a portion of the display panel shown in FIG. 4A.

FIG. 4A is a schematic plan view of the display panel 50 shown in FIG. 2. FIG. 4B is a schematic cross-sectional view of a portion of the display panel 50 shown in FIG. 4A.

Referring to FIGS. 4A and 4B, the display panel 50 may include the display area DA and the peripheral area NDA as described above. Sub-pixels may be arranged in the display area DA to display images, and wirings, etc. may be arranged in the peripheral area NDA. The display panel 50 may include the substrate 100, a buffer layer 111, a circuit layer PCL, and a display element layer EDL which are stacked.

As mentioned above, the substrate 100 may include an insulating material such as glass, quartz, a polymer resin, or a combination thereof. The substrate 100 may be a rigid substrate or a flexible substrate that is bendable, foldable, or rollable.

The buffer layer 111 may be positioned on the substrate 100 and may reduce or prevent infiltration of a foreign material, moisture, or ambient air from a lower portion of the substrate 100 and may provide a flat surface on the substrate 100. The buffer layer 111 may include an inorganic material, such as an oxide, nitride, or a combination thereof, an organic material, or an organic-inorganic composite material, and may have a single layer structure or a multilayer structure including an inorganic material or an organic material. A barrier layer (not shown) may be further included between the substrate 100 and the buffer layer 111 to block penetration of ambient air. In some embodiments, the buffer layer 111 may include silicon oxide ($SiO_2$), silicon nitride ($SiN_x$), or a combination thereof. The buffer layer 111 may include a first buffer layer 111a and a second buffer layer 111b that are stacked.

The circuit layer PCL may be arranged on the buffer layer 111 and may include a pixel circuit PC, a first gate insulating layer 112, a second gate insulating layer 113, an interlayer insulating layer 115, and a planarization layer 117. A pixel circuit PC may include a main thin-film transistor TFT and a main storage capacitor Cst.

The main thin-film transistor TFT may be arranged on the buffer layer 111. The main thin-film transistor TFT may include a first semiconductor layer A1, a first gate electrode G1, a first source electrode S1, and a first drain electrode D1, and an auxiliary thin-film transistor TFT may include a second semiconductor layer, a second gate electrode, a second source electrode, and a second drain electrode. The main thin-film transistor TFT may be connected to a main organic light-emitting diode OLED and may drive the main organic light-emitting diode OLED.

The first semiconductor layer A1 may be arranged on the buffer layer 111 and may include polycrystalline silicon. In another embodiment, the first semiconductor layer A1 may include amorphous silicon. In another embodiment, the first semiconductor layer A1 may include an oxide made of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel region, a source region, and a drain region, and the source region and the drain region may be doped with impurities.

The first gate insulating layer 112 may cover the first semiconductor layer A1. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zinc peroxide ($ZnO_2$). The first gate insulating layer 112 may be a single layer or multi-layer including the aforementioned inorganic insulating materials.

The first gate electrode G1 may be arranged on the first gate insulating layer 112 to overlap the first semiconductor layer A1. The first gate electrode G1 may include at least one of molybdenum (Mo), aluminum (Al), copper (Cu), and titanium (Ti) and include a single layer or a multi-layer. As an example, the first gate electrode G1 may include a single Mo layer.

The second gate insulating layer 113 may cover the first gate electrode G1. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zinc peroxide ($ZnO_2$). The second gate insulating layer 113 may include a single layer or multi-layer including the aforementioned inorganic insulating materials.

A first top electrode CE2 of the main storage capacitor Cst may be arranged on the second gate insulating layer 113.

In the display area DA, the first top electrode CE2 may overlap the first gate electrode G1 therebelow. The first gate electrode G1 and the first top electrode CE2 overlapping each other with the second gate insulating layer 113 therebetween may constitute the main storage capacitor Cst. The first gate electrode G1 may include the first lower electrode CE1 of the main storage capacitor Cst.

The first top electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and include a single layer or a multi-layer including the aforementioned materials.

The interlayer insulating layer 115 may cover the first top electrode CE2. The interlayer insulating layer 115 may include $SiO_2$, $SiN_x$, SiON, $Al_2O_3$, $TiO_2$, $Ta_2O_5$, $HfO_2$, and/or $ZnO_2$. The interlayer insulating layer 115 may include a single layer or multi-layer including the aforementioned inorganic insulating materials.

The first source electrode S1 and the first drain electrode D1 may be arranged on the interlayer insulating layer 115. The first source electrode S1 and the first drain electrode D1 may each include a conductive material including molybdenum (Mo), aluminum (Al), copper (Cu), and titanium (Ti) and include a single layer or a multi-layer structure including the aforementioned materials. As an example, the first source electrode S1 and the first drain electrode D1 may have a multi-layered structure of Ti/Al/Ti.

The planarization layer 117 may cover the first source electrode S1 and the first drain electrode D1. The planarization layer 117 may have a flat top surface such that a pixel electrode 121 is formed thereon to be flat.

The planarization layer 117 may include an organic material or an inorganic material and may have a single layer structure or a multi-layer structure. The planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like. The planarization layer 117 may include an inorganic insulating material such as silicon oxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zinc peroxide ($ZnO_2$). While the planarization layer 117 is formed, a layer may be formed, and chemical and mechanical polishing may be performed on the top surface of the layer to provide a flat top surface.

The planarization layer 117 may include a via hole exposing one of the first source electrode S1 and the first drain electrode D1 of the main thin-film transistor TFT. The pixel electrode 121 may be electrically connected to the main thin-film transistor TFT by contacting the first source electrode S1 or the first drain electrode D1 through the via hole.

The pixel electrode 121 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 121 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. As an example, the pixel electrode 121 may have a structure including a layer including ITO, IZO, ZnO, or $In_2O_3$ on/under the reflective layer. The pixel electrode 121 may have a structure of ITO/Ag/ITO that are stacked.

A pixel-defining layer 119 may cover the edges of the pixel electrode 121 on the planarization layer 117 and include a first opening OP1 exposing the central portion of the pixel electrode 121. An emission area of the organic light-emitting diode OLED, for example, the size and shape of a sub-pixel may be defined by the first opening OP1.

The pixel-defining layer 119 may prevent an arc, etc. from occurring at the edges of the pixel electrode 121 by increasing a distance between the edges of the pixel electrode 121 and an opposite electrode 123 over the pixel electrode 121. The pixel-defining layer 119 may include an organic insulating material such as polyimide, polyamide, acrylic resin, BCB, HMDSO, and phenolic resin, and may be formed by spin coating or the like.

A first emission layer 122b may be arranged in the first opening OP1 of the pixel-defining layer 119 to correspond to each pixel electrode 121. The first emission layer 122b may include a polymer material or a low molecular weight material and emit red, green, blue, or white light.

An organic functional layer 122e may be arranged on and/or under the first emission layer 122b. The organic functional layer 122e may include a first functional layer 122a and/or a second functional layer 122c. The first functional layer 122a or the second functional layer 122c may be omitted.

The first functional layer 122a may be arranged under the first emission layer 122b. The first functional layer 122a may include a single layer or a multi-layer including an organic material. The first functional layer 122a may be a hole transport layer (HTL) that is a single layer. In another embodiment, the first functional layer 122a may include a hole injection layer (HIL) and an HTL. The first functional layer 122a may be integral to correspond to organic light-emitting diodes OLED included in the display area DA and the component area CA.

The second functional layer 122c may be arranged on the first emission layer 122b. The second functional layer 122c may include a single layer or a multi-layer including an organic material. The second functional layer 122c may include an electron transport layer (ETL) and/or an electron injection layer (EIL). The second functional layer 122c may be integral to correspond to the organic light-emitting diodes OLED included in the display area DA.

The opposite electrode 123 may be arranged on the second functional layer 122c. The opposite electrode 123 may include a conductive material having a low work function. For example, the opposite electrode 123 may include a transparent or semitransparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. In another embodiment, the opposite electrode 123 may further include a layer, such as ITO, IZO, ZnO, or $In_2O_3$, on the transparent or semi-transparent layer including any of the above-described materials. The opposite electrode 123 may be integral to correspond to the organic light-emitting diodes OLEDs included in the display area DA.

The layers from the pixel electrode 121 to the opposite electrode 123 in the display area DA may constitute the main organic light-emitting diode OLED.

A top layer 150 may be formed on the opposite electrode 123, and the top layer 150 may include an organic material. The top layer 150 may protect the opposite electrode 123 and also increase light extraction efficiency. The top layer 150 may include an organic material having a higher refractive index than the opposite electrode 123. In another embodiment, the top layer 150 may include layers of different refractive indexes that are stacked. As an example, the top layer 150 may include a high refractive index layer/a low refractive index layer/a high refractive index layer. A refractive index of the high refractive index layer may be about 1.7 or more, and a refractive index of the low refractive index layer may be about 1.3 or less.

The top layer 150 may include lithium fluoride (LiF). In another embodiment, the top layer 150 includes an inorganic insulating material such as silicon oxide ($SiO_2$) and silicon nitride ($SiN_x$). The top layer 150 may be omitted when needed. Hereinafter, for convenience of description, the case where the top layer 150 is arranged on the opposite electrode 123 will be described in detail.

Though not shown, the display panel 50 may include an encapsulation member (not shown) shielding the top layer 150. As an embodiment, the encapsulation member may include an encapsulation substrate (not shown) and a sealing member (not shown), the encapsulation substrate being arranged to face the substrate 100, and the sealing member being arranged between the substrate 100 and the encapsulation substrate to block a space between the substrate 100 and the encapsulation substrate from the outside.

As another example, the encapsulation member may include a thin-film encapsulation layer. The thin-film encapsulation layer may be arranged to contact the top layer 150. The thin-film encapsulation layer may cover the portions of the display area DA and the peripheral area NDA to prevent the penetration of external moisture and oxygen. The thin-film encapsulation layer may include at least one organic encapsulation layer and at least one inorganic encapsulation layer. Hereinafter, for convenience of description, the case where the thin-film encapsulation layer includes a first inorganic encapsulation layer, an organic encapsulation layer, and a second inorganic encapsulation layer that are sequentially stacked on the top layer 150 will be described in detail.

The first inorganic encapsulation layer may cover the opposite electrode 123 and include silicon oxide, silicon nitride, and/or silicon oxynitride. Since the first inorganic encapsulation layer may be formed depending on a structure thereunder, the top surface of the first inorganic encapsulation layer may not be flat. The organic encapsulation layer may cover the first inorganic encapsulation layer. Unlike the first inorganic encapsulation layer, the top surface of the organic encapsulation layer may be substantially flat. In an embodiment, the top surface of the organic encapsulation layer may be flat in a portion thereof corresponding to the display area DA. The organic encapsulation layer may include at least one of polyethylene terephthalate, polyethylene naphthalate, polycarbonate, polyimide, polyethylene sulfonate, polyoxymethylene, polyarylate, and hexamethyldisiloxane. The second inorganic encapsulation layer may cover the organic encapsulation layer and include silicon oxide, silicon nitride, and/or silicon oxynitride.

A touchscreen layer may be arranged on the encapsulation member.

Figure 5A:
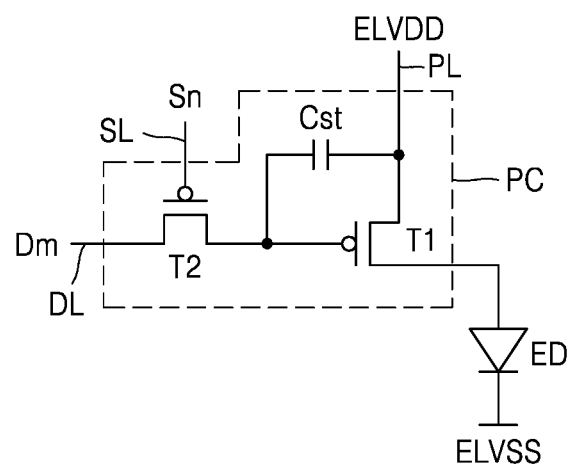
FIGS. 5A and 5B are schematic diagrams of equivalent circuits of a pixel circuit driving a sub-pixel of the display panel shown in FIG. 4A.
Figure 5B:
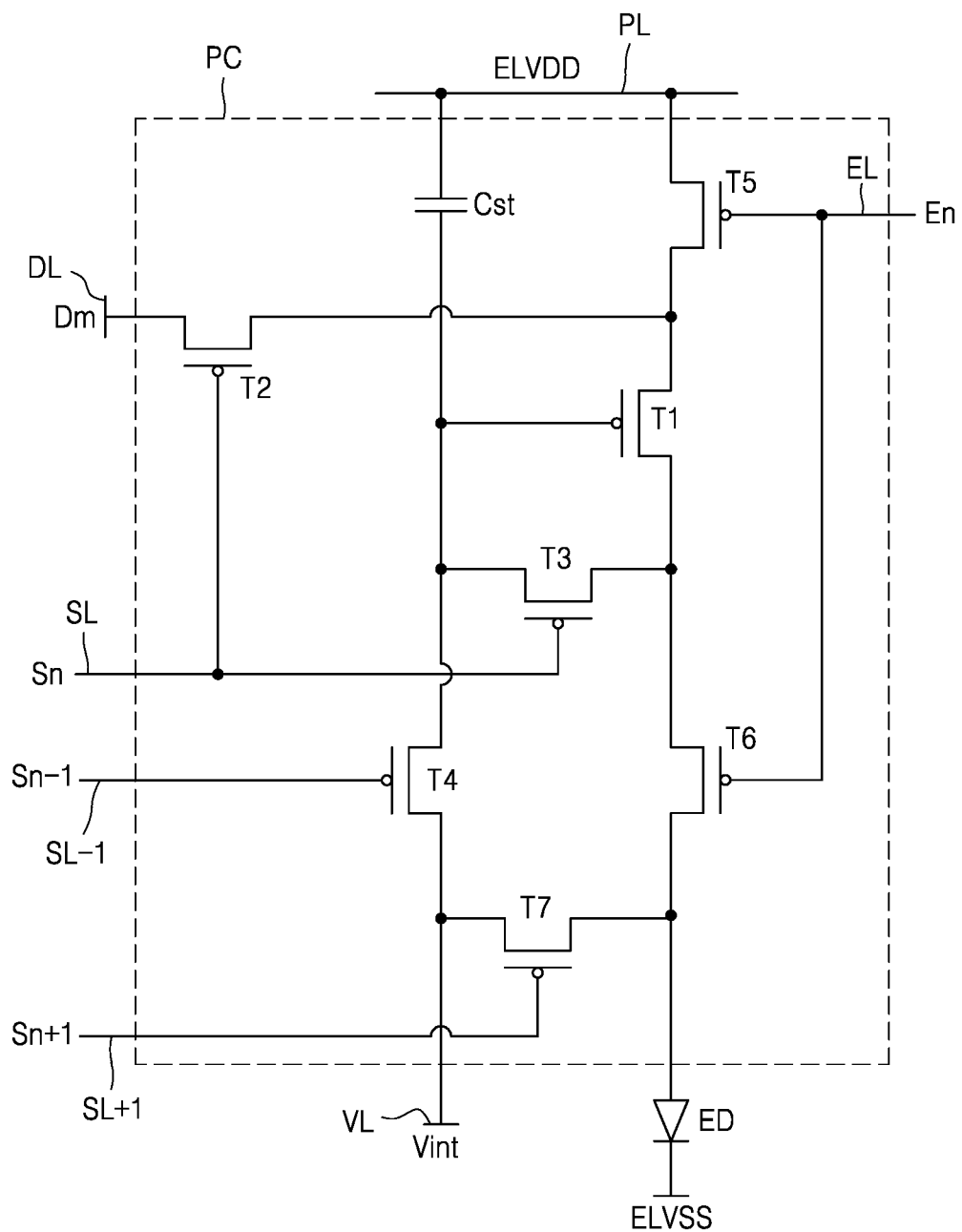

FIGS. 5A and 5B are schematic diagrams of equivalent circuits of a pixel circuit driving a sub-pixel of the display panel shown in FIG. 4A.

Referring to FIGS. 5A and 5B, the pixel circuit PC may be connected to a light-emitting device ED to allow light-emission of sub-pixels. The pixel circuit PC may include a driving thin-film transistor T1, a switching thin-film transistor T2, and a storage capacitor Cst. The switching thin-film transistor T2 may be connected to the scan line SL and the data line DL, and transmit, to the driving thin-film transistor T1, a data signal Dm input via the data line DL according to a scan signal Sn input via the scan line SL.

The storage capacitor Cst may be connected to the switching thin-film transistor T2 and a driving voltage line PL, and store a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst, and may control a driving current flowing from the driving voltage line PL to the light-emitting device ED, in response to a voltage value stored in the storage capacitor Cst. The light-emitting device ED may emit light having a certain brightness due to the driving current.

Though FIG. 5A describes the case where the pixel circuit PC may include two thin-film transistors and one storage capacitor, the embodiment is not limited thereto.

Referring to FIG. 5B, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

FIG. 5B shows the case where each pixel circuit PC includes signal lines, for example, a scan line SL, a previous scan line SL−1, a next scan line SL+1, an emission control line EL, and a data line DL, an initialization voltage line VL, and a driving voltage line PL. However, the embodiment is not limited thereto. According to another embodiment, at least one of the signal lines, for example, the scan line SL, the previous scan line SL−1, the next scan line SL+1, the emission control line EL, and the data line DL, and the initialization voltage line VL may be shared by neighboring pixel circuits.

A drain electrode of the driving thin-film transistor T1 may be electrically connected to the light-emitting device ED via the emission control thin-film transistor T6. The driving thin-film transistor T1 may receive the data signal Dm according to a switching operation of the switching thin-film transistor T2 and supply a driving current to the light-emitting device ED.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to the source electrode of the driving thin-film transistor T1 and may be connected to the driving voltage line PL via the operation control thin-film transistor T5.

The switching thin-film transistor T2 may be turned on according to the scan signal Sn received via the scan line SL and perform a switching operation of transmitting the data signal Dm received from the data line DL, to the source electrode of the driving thin-film transistor T1.

A gate electrode of the compensating thin-film transistor T3 may be connected to the scan line SL. A source electrode of the compensating thin-film transistor T3 may be connected to the drain electrode of the driving thin-film transistor T1 and may be connected to a pixel electrode of the light-emitting device ED via the emission control thin-film transistor T6. A drain electrode of the compensating thin-film transistor T3 may be connected to an electrode of the storage capacitor Cst, a source electrode of the first initialization thin-film transistor T4, and a gate electrode of the driving thin-film transistor T1. The compensation thin film transistor T3 may be turned on according to the scan signal Sn received via the scan line SL and connect the gate electrode and the drain electrode of the driving thin film transistor T1 to each other, thereby forming a diode-connection of the driving thin-film transistor T1.

A gate electrode of the first initialization thin-film transistor T4 may be connected to the previous scan line SL−1. A drain electrode of the first initialization thin-film transistor T4 may be connected to the initialization voltage line VL. A source electrode of the first initialization thin-film transistor T4 may be connected to one of electrodes of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line SL−1 and may perform an initialization operation of initializing the voltage of the gate electrode of the driving thin-film transistor T1 by transferring an initialization voltage Vint to the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to a pixel electrode of the light-emitting device ED. The operation control thin-film transistor T5 and the emission control thin-film transistor T6 turned on according to an emission control signal En received through the emission control line EL, the deriving voltage ELVDD may be transferred to the light-emitting device ED, and a driving current may flow through the light-emitting diode ED.

A gate electrode of the second initialization thin-film transistor T7 may be connected to the next scan line SL+1. A source electrode of the second initialization thin-film transistor T7 may be connected to the pixel electrode of the light-emitting device ED. A drain electrode of the second initialization thin-film transistor T7 may be connected to the initialization voltage line VL. The second initialization thin-film transistor T7 may be turned on according to a next scan signal Sn+1 received via the next scan line SL+1 and may initialize the pixel electrode of the light-emitting device ED.

Though FIG. 5B shows the case where the first initialization thin-film transistor T4 and the second initialization thin-film transistor T7 may be respectively connected to the previous scan line SL−1 and the next scan line SL+1, the embodiment is not limited thereto. In another embodiment, the first initialization thin-film transistor T4 and the second initialization thin-film transistor T7 may be connected to the previous scan line SL−1 and driven according to a previous scan line Sn−1.

Another electrode of the storage capacitor Cst may be connected to the driving voltage line PL. An electrode of the storage capacitor Cst may be connected to the gate electrode of the driving thin-film transistor T1, the drain electrode of the compensation thin-film transistor T3, and the source electrode of the first initialization thin-film transistor T4.

An opposite electrode (for example, a cathode) of the light-emitting device ED may receive a common voltage ELVSS. The light-emitting device ED may receive the driving current from the driving thin-film transistor T1 and emit light.

The pixel circuit PC is not limited to the number of thin-film transistors, the number of storage capacitors, and the design described with reference to FIGS. 5A and 5B, and the number of thin-film transistors, the number of storage capacitors, and the circuit design may be variously changed.

Figure 6:
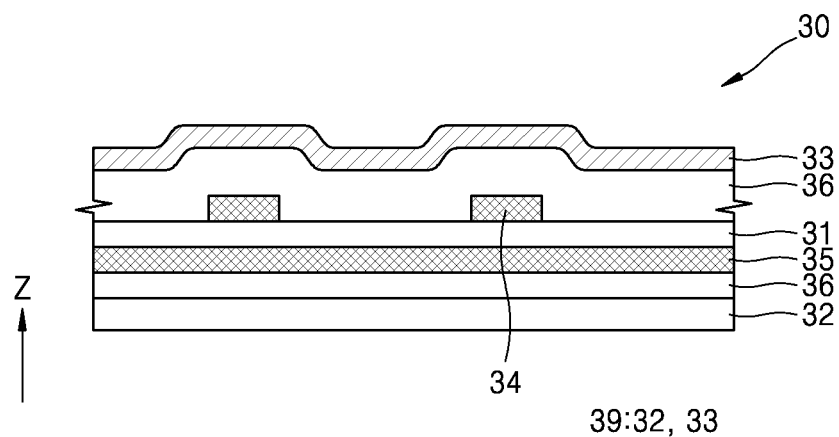
FIG. 6 is a schematic cross-sectional view of a portion of a digitizer shown in FIG. 2 according to an embodiment.

FIG. 6 is a schematic cross-sectional view of a portion of the digitizer 30 shown in FIG. 2 according to an embodiment.

Referring to FIG. 6, the digitizer 30 may include a base layer (not shown) and a blocking layer 39. The base layer may be arranged in various forms. As an example, the base layer may include a body layer 31, a first pattern layer 34, and a second pattern layer 35. The first pattern layer 34 and the second pattern layer 35 may be respectively arranged on different surfaces of the body layer 31. In another embodiment, the first pattern layer 34 and the second pattern layer 35 may be arranged to be stacked on each other. For example, the first pattern layer 34 and the second pattern layer 35 may be stacked on different layers. Hereinafter, for convenience of description, the case where the first pattern layer 34 and the second pattern layer 35 of the digitizer 30 are arranged on different surfaces of the same body layer 31 will be described in detail.

The first pattern layer 34 may be arranged on a first surface of the body layer 31, and the second pattern layer 35 may be arranged on a second surface of the body layer 31. The first pattern layer 34 may directly contact the first surface, and the second pattern layer 35 may directly contact the second surface. The first pattern layer 34 and the second pattern layer 35 may be formed by stacking pattern layers on a first surface and a second surface, and leaving a portion of the pattern layer and removing another portion of the layer.

The first pattern layer 34 and the second pattern layer 35 may include a loop coil shape. The first pattern layer 34 and the second pattern layer 35 may be used to determine the position of an electronic pen by generating an induced current in case that the electronic pen contacts or hovers over a display apparatus 1. The first pattern layer 34 and the second pattern layer 35 may be arranged in different directions. As an example, in case that the first pattern layer 34 is arranged in one direction of an X-direction and a Y-direction, the second pattern layer 35 may be arranged in the other direction of the X-direction and the Y-direction. The first pattern layer 34 and the second pattern layer 35 may be arranged to intersect each other.

The base layer may include at least one of a first cover layer 32 and a second cover layer 33 respectively arranged on the first pattern layer 34 and the second pattern layer 35. The first cover layer 32 and the second cover layer 33 may prevent the first pattern layer 34 and the second pattern layer 35 from being exposed to external moisture or oxygen, etc. and thus being oxidized by completely shielding the first pattern layer 34 and the second pattern layer 35.

The first cover layer 32 may be used as a blocking layer 39. The blocking layer 39 may take on a black color. As an example, the blocking layer 39 may include a light-absorbing material including at least one of a polyimide resin, black dye, black pigment, and a black filler. The blocking layer 39 may be integral with the first cover layer 32 to prevent the digitizer 30 from being viewed to the outside of the display apparatus 1, the first cover layer 32 being arranged on the top surface of the digitizer 30 that faces the second surface 50-2 of the display panel 50.

An adhesive layer 36 may be arranged between the second cover layer 33 and the body layer 31, and between the body layer 31 and the blocking layer 39. The adhesive layer 36 may be integral with the second cover layer 33 and the blocking layer 39. For example, the adhesive layer 36 may surround the first pattern layer 34 and the second pattern layer 35 in the case where the second cover layer 33 and the blocking layer 39 are attached to the body layer 31.

An outer surface of at least one of the second cover layer 33 and the blocking layer 39 may be bent. For example, the blocking layer 39 may protrude from a portion in which the first pattern layer 34 is arranged, and the second cover layer 33 may protrude from a portion in which the second pattern layer 35 is arranged.

The first cover layer 32 and the second cover layer 33 may include a material that is the same as or similar to that of the body layer 31. In the case where the second cover layer 33 serves as the blocking layer 39, the second cover layer 33 may include a material that is the same as or similar to that of the body layer 31.

In the case where a general digitizer is arranged under the display panel 50, in case that the display panel does not operate, at least one of the first pattern layer and the second pattern layer of the digitizer 30 may be viewed from the outside through the display panel. Even in the case where the display panel operates, since an image displayed on the display panel may overlap the pattern layer of the digitizer 30, a user may feel that the image displayed on the display panel 50 is not clear. Particularly, in the case where the display apparatus 1 is folded, the pattern layer of the digitizer 30 may be viewed at a folded portion of the display apparatus 1. Furthermore, in the case where a display apparatus in which a cushion portion, an embossed portion, etc. are arranged under a display panel is manufactured to be foldable, at least one of the cushion portion and the embossed portion wrinkles in a folded region of the display apparatus and thus the folded portion of the display apparatus may not form a curve. In the case where both the cushion portion and the embossed portion may be removed to resolve this issue, the digitizer 30 may be arranged under the display panel and the above-mentioned issue may occur.

In contrast, in the case where the digitizer 30 may include the blocking layer 39, since the first pattern layer 34 and the second pattern layer 35 are hidden by the blocking layer 39, and thus the first pattern layer 34 and the second pattern layer 35 may be prevented from being viewed through the display panel 50.

For example, in the case where the display panel 50 operates, or even in the case where the display panel 50 does not operate, since external light passing through the display panel 50 may be blocked by the blocking layer 39, the external light may be prevented from being reflected by at least one of the first pattern layer 34 and the second pattern layer 35.

Figure 7:
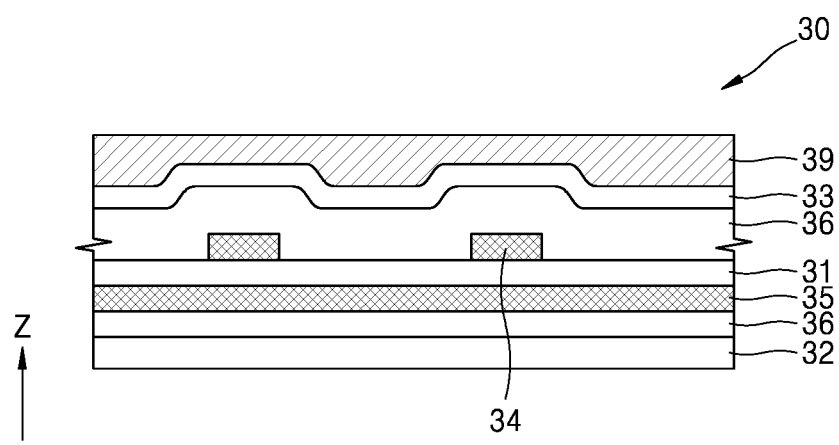
FIG. 7 is a schematic cross-sectional view of a portion of a digitizer shown in FIG. 2 according to another embodiment.

Accordingly, the digitizer 30 and the display apparatus 1 may not be viewed from the outside. The display apparatus 1 may display a clear image by preventing external light from being reflected by the pattern layer of the digitizer 30. The display apparatus 1 may prevent a bent portion from being wrinkled or uneven while the display apparatus 1 is folded. FIG. 7 is a schematic cross-sectional view of a portion of the digitizer 30 shown in FIG. 2 according to another embodiment.

Referring to FIG. 7, the digitizer 30 may include the base layer and the blocking layer 39. The base layer may include the body layer 31, the first pattern layer 34, the second pattern layer 35, the first cover layer 32, the second cover layer 33, and the adhesive layer 36. Since the body layer 31, the first pattern layer 34, the second pattern layer 35, the first cover layer 32, the second cover layer 33, and the adhesive layer 36 are similar to those described with reference to FIG. 6, detailed descriptions thereof are omitted.

The blocking layer 39 may be arranged over the first cover layer 32. The blocking layer 39 may take on a black color as described in FIG. 6. The top surface of the blocking layer 39 may be flat. For example, a surface of the blocking layer 39 that faces the second surface 50-2 of the display panel 50 may be flat. The blocking layer 39 may completely absorb external light passing through the display panel 50 and incident to the display apparatus 1.

Accordingly, the digitizer 30 and the display apparatus 1 may not be viewed to the outside. The display apparatus 1 may display a clear image by preventing external light from being reflected by the pattern layer of the digitizer 30. The display apparatus 1 may prevent a bent portion from being wrinkled or uneven while the display apparatus 1 is folded.

Figure 8:
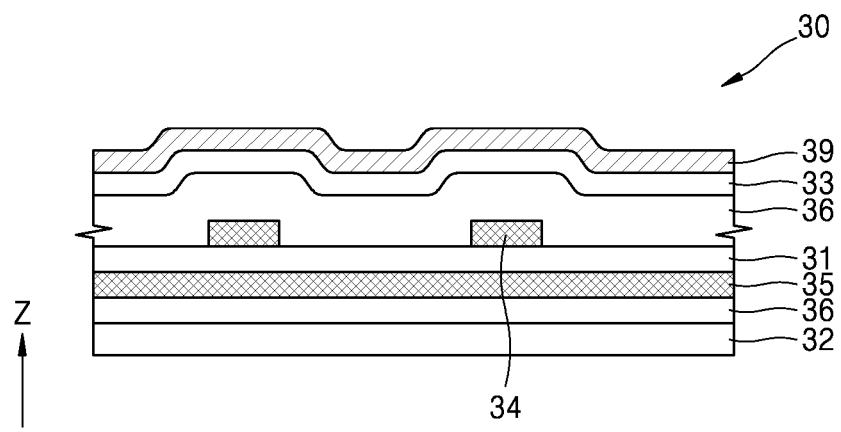
FIG. 8 is a schematic cross-sectional view of a portion of a digitizer shown in FIG. 2 according to another embodiment.

FIG. 8 is a schematic cross-sectional view of a portion of the digitizer 30 shown in FIG. 2 according to another embodiment.

Referring to FIG. 8, the digitizer 30 may include a base layer (not shown) and the blocking layer 39. The base layer may include the body layer 31, the first pattern layer 34, the second pattern layer 35, the first cover layer 32, the second cover layer 33, and the adhesive layer 36. Since the body layer 31, the first pattern layer 34, the second pattern layer 35, the first cover layer 32, the second cover layer 33, and the adhesive layer 36 are similar to those described with reference to FIG. 6, detailed descriptions thereof are omitted.

The blocking layer 39 may be arranged over the first cover layer 32. The blocking layer 39 may take on a black color as described in FIG. 6. The blocking layer 39 may be coated on the first cover layer 32 by using black dye or black pigment, etc. Since the blocking layer 39 is formed along the top surface of the first cover layer 32, the blocking layer 39 may have a top surface that is the same as or substantially similar to the top surface of the first cover layer 32. For example, the thickness of the cross-section of the blocking layer 39 may be maintained substantially constant.

Accordingly, the digitizer 30 and the display apparatus 1 may not be viewed to the outside. The display apparatus 1 may display a clear image by preventing external light from being reflected by the pattern layer of the digitizer 30. The display apparatus 1 may prevent a bent portion from being wrinkled or uneven while the display apparatus 1 is folded.

Figure 9:
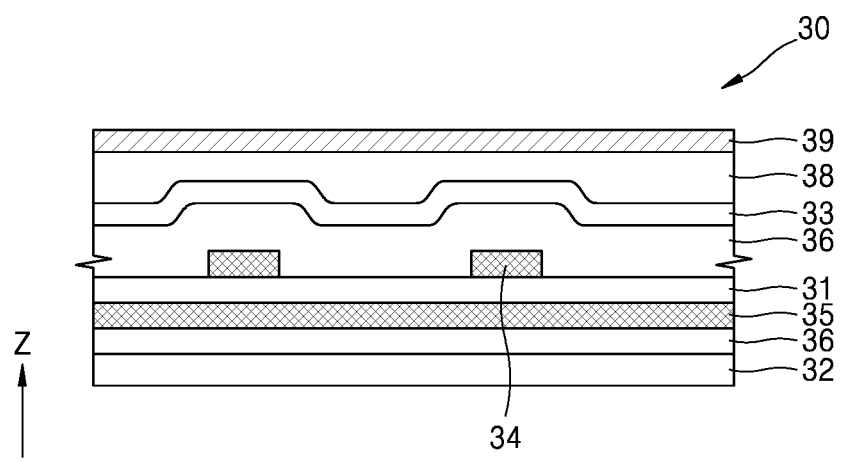
FIG. 9 is a schematic cross-sectional view of a portion of a digitizer shown in FIG. 2 according to another embodiment.

FIG. 9 is a schematic cross-sectional view of a portion of the digitizer 30 shown in FIG. 2 according to another embodiment.

Referring to FIG. 9, the digitizer 30 may include a base layer (not shown), a base planarization layer 38, and the blocking layer 39. The base layer may include the body layer 31, the first pattern layer 34, the second pattern layer 35, the first cover layer 32, the second cover layer 33, and the adhesive layer 36. Since the body layer 31, the first pattern layer 34, the second pattern layer 35, the first cover layer 32, the second cover layer 33, and the adhesive layer 36 are similar to those described with reference to FIG. 6, detailed descriptions thereof are omitted.

The base planarization layer 38 may be arranged on the first cover layer 32. The base planarization layer 38 may be supplied in the form of resin over the first cover layer 32. The base planarization layer 38 may be hardened after the first cover layer 32 is arranged. The top surface of the base planarization layer 38 may constitute a flat surface. In case that arranging the blocking layer 39 afterwards, the blocking layer 39 may be uniformly arranged, and the blocking layer 39 may be prevented from being separated from the base planarization layer 38.

The blocking layer 39 may be arranged on the base planarization layer 38. The blocking layer 39 may take on a black color as described with reference to FIG. 6. The blocking layer 39 may be coated on the base planarization layer 38 by using black dye or black pigment, etc. Since the blocking layer 39 is formed along the top surface of the base planarization layer 38, the blocking layer 39 may have a top surface that is the same as or substantially similar to the top surface of the base planarization layer 38. For example, the thickness of the cross-section of the blocking layer 39 may be maintained substantially constant Accordingly, the digitizer 30 and the display apparatus 1 may not be viewed to the outside. The display apparatus 1 may display a clear image by preventing external light from being reflected by the pattern layer of the digitizer 30. The display apparatus 1 may prevent a bent portion from being wrinkled or uneven while the display apparatus 1 is folded.

Figure 10:
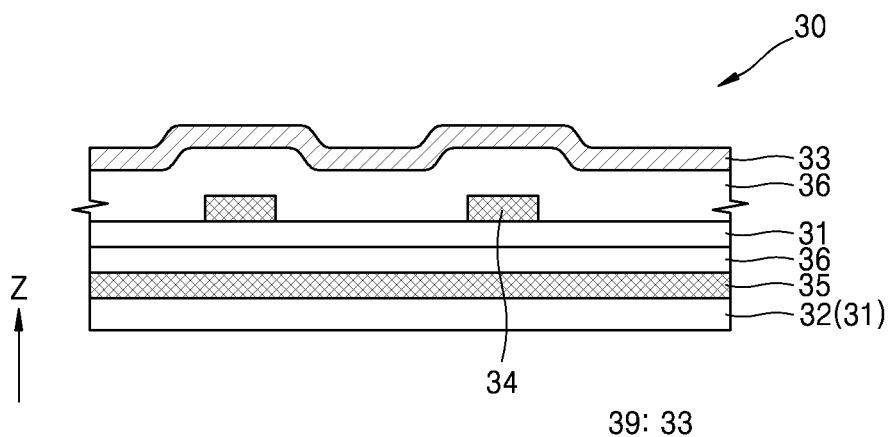
FIG. 10 is a schematic cross-sectional view of a portion of a digitizer shown in FIG. 2 according to another embodiment.

FIG. 10 is a schematic cross-sectional view of a portion of the digitizer 30 shown in FIG. 2 according to another embodiment.

Referring to FIG. 10, the digitizer 30 may include a base layer (not shown) and the blocking layer 39. The base layer may include the first pattern layer 34, the second pattern layer 35, the body layer 31, the first cover layer 32, and the second cover layer 33. The first pattern layer 34, the second pattern layer 35, the body layer 31, the first cover layer 32, and the second cover layer 33 may be stacked on different layers. As an example, the second pattern layer 35 may be arranged on the first cover layer 32, the adhesive layer 36 may be arranged on the second pattern layer 35, and the body layer 31 may be arranged on the adhesive layer 36. The first pattern layer 34 and another adhesive layer 36 may be sequentially arranged on the body layer 31, and the second cover layer 33 may be arranged on the adhesive layer 36. The first cover layer 32 may include the same material as the body layer 31. For example, the first cover layer 32 may include the same type as the body layer 31.

The second cover layer 33 may serve as the blocking layer 39. For example, the second cover layer 33 and the blocking layer 39 may be integral.

In the case where a user views the display apparatus 1 in the display area DA, the blocking layer 39 may prevent the first pattern layer 34 and the second pattern layer 35 from being viewed.

Accordingly, the digitizer 30 and the display apparatus 1 may not be viewed from the outside. The display apparatus 1 may display a clear image by preventing external light from being reflected by the pattern layer of the digitizer 30. The display apparatus 1 may prevent a bent portion from being wrinkled or uneven while the display apparatus 1 is folded.

Figure 11:
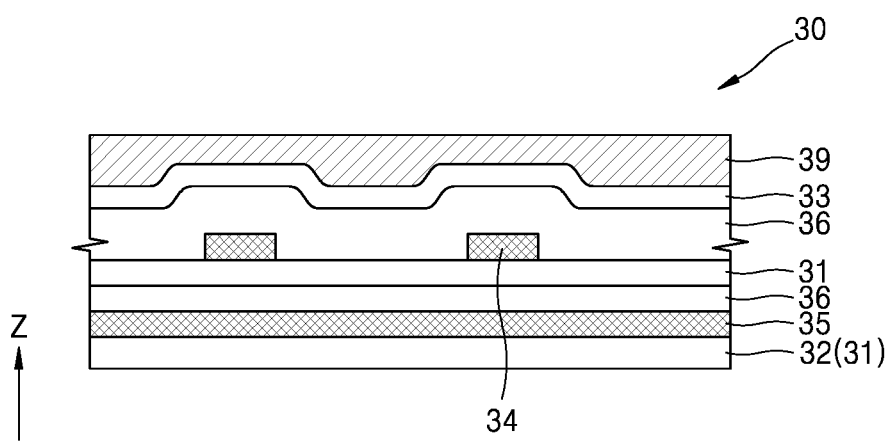
FIG. 11 is a schematic cross-sectional view of a portion of a digitizer shown in FIG. 2 according to another embodiment.

FIG. 11 is a schematic cross-sectional view of a portion of the digitizer 30 shown in FIG. 2 according to another embodiment.

Referring to FIG. 11, the digitizer 30 may include a base layer (not shown) and the blocking layer 39. The base layer may include the body layer 31, the first cover layer 32, the second cover layer 33, the first pattern layer 34, the second pattern layer 35, and the adhesive layer 36. The base layer may be the same as that described in FIG. 10.

The blocking layer 39 may be arranged on the base layer. The blocking layer 39 may include polyimide and a synthetic resin and include a material in which a light-absorbing material such as black dye or black pigment, etc. are mixed.

A surface of the blocking layer 39 may be flat. For example, in the case where the second cover layer 33 has a curvature due to the first pattern layer 34, the blocking layer 39 may be arranged on the second cover layer 33 to remove a step difference formed by the second cover layer 33.

The blocking layer 39 may prevent the first pattern layer 34 and the second pattern layer 35 from being viewed from the outside.

Accordingly, the digitizer 30 and the display apparatus 1 may not be viewed to the outside. The display apparatus 1 may display a clear image by preventing external light from being reflected by the pattern layer of the digitizer 30. The display apparatus 1 may prevent a bent portion from being wrinkled or uneven while the display apparatus 1 is folded.

Figure 12:
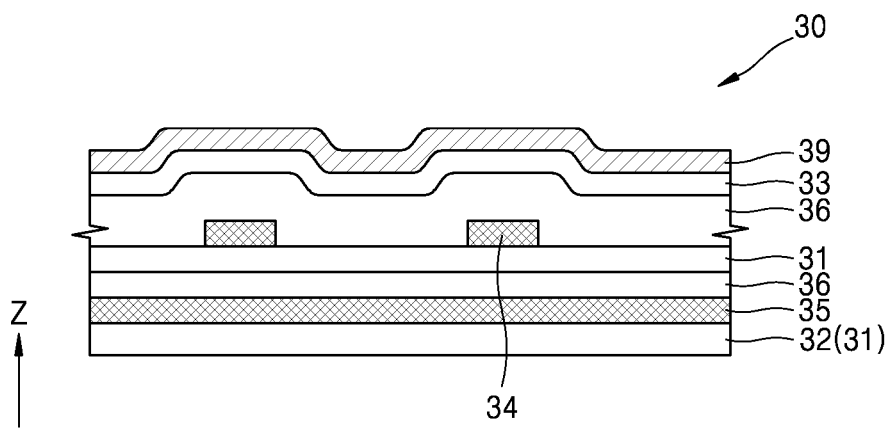
FIG. 12 is a schematic cross-sectional view of a portion of a digitizer shown in FIG. 2 according to another embodiment.

FIG. 12 is a schematic cross-sectional view of a portion of the digitizer 30 shown in FIG. 2 according to another embodiment.

Referring to FIG. 12, the digitizer 30 may include a base layer (not shown) and the blocking layer 39. The base layer may include the body layer 31, the first cover layer 32, and the second cover layer 33, the first pattern layer 34, the second pattern layer 35, and the adhesive layer 36. The base layer may be the same as that described in FIG. 10.

The blocking layer 39 may be arranged on the second cover layer 33. The blocking layer 39 may include black ink, etc. and may be coated on the second cover layer 33.

Accordingly, the digitizer 30 and the display apparatus 1 may not be viewed to the outside. The display apparatus 1 may display a clear image by preventing external light from being reflected by the pattern layer of the digitizer 30. The display apparatus 1 may prevent a bent portion from being wrinkled or uneven while the display apparatus 1 is folded.

Figure 13:
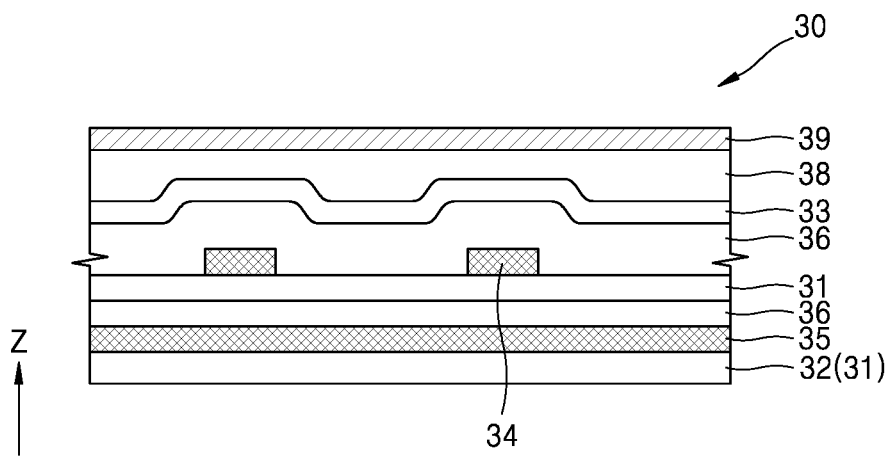
FIG. 13 is a schematic cross-sectional view of a portion of a digitizer shown in FIG. 2 according to another embodiment.

FIG. 13 is a schematic cross-sectional view of a portion of the digitizer 30 shown in FIG. 2 according to another embodiment.

Referring to FIG. 13, the digitizer 30 may include a base layer (not shown), the base planarization layer 38, and the blocking layer 39. The base layer may include the body layer 31, the first cover layer 32, and the second cover layer 33, the first pattern layer 34, the second pattern layer 35, and the adhesive layer 36. The base layer may be the same as that described in FIG. 10.

The blocking layer 39 may be arranged over the second cover layer 33. The base planarization layer 38 may include a resin material to planarize the bending of the second cover layer 33. The base planarization layer 38 may be arranged on the second cover layer 33 and hardened. While the base planarization layer 38 is hardened, the top surface of the base planarization layer 38 may constitute a flat surface.

The blocking layer 39 may be arranged on the top surface of the base planarization layer 38. The blocking layer 39 may be coated on the top surface of the base planarization layer 38 by using black ink, etc. In another embodiment, the blocking layer 39 may be bonded to the top surface of the base planarization layer 38 in the form of a film. In another embodiment, the blocking layer 39 may include a material that is the same as or similar to the body layer 31 as shown in FIG. 10 or 11, and include a material in which a light-absorbing material such as black dye or black pigment, etc. are mixed.

Accordingly, the digitizer 30 and the display apparatus 1 may not be viewed to the outside. The display apparatus 1 may display a clear image by preventing external light from being reflected by the pattern layer of the digitizer 30. The display apparatus 1 may prevent a bent portion from being wrinkled or uneven while the display apparatus 1 is folded.

The display apparatus according to embodiments may display an image having a clear image quality. In the display apparatus according to embodiments, at least a portion thereof may be folded.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims including their equivalents.

What is claimed is:
1. A digitizer comprising:
a base layer made of an electrically insulative material in which a metal pattern is disposed; and
a blocking layer spaced apart from the metal pattern and disposed on the base layer, the blocking layer to block light so as to prevent the metal pattern from being viewed through a display panel, wherein
a top surface of the base layer on which the blocking layer is disposed is uneven corresponding to a thickness and arrangement of the metal pattern, the top surface being a main surface of the base layer facing toward the blocking layer, and the blocking layer includes a surface facing the base layer that is uneven corresponding to the thickness and arrangement of the metal pattern in the base layer.

2. The digitizer of claim 1, wherein the blocking layer is black and uniformly arranged so as to have no holes.

3. The digitizer of claim 1, further comprising a base planarization layer disposed between the blocking layer and the base layer.

4. The digitizer of claim 1, wherein the blocking layer and the base layer are integral with each other.

5. The digitizer of claim 1, wherein the base layer includes:
a body layer; and
a pattern layer disposed on the body layer.

6. The digitizer of claim 1, wherein a side of the blocking layer is substantially flat.

7. The digitizer of claim 1, further comprising a heat-dissipating plate extended to the base layer.

8. The digitizer of claim 7, wherein the heat-dissipating plate is bendable.

9. A display apparatus comprising:
a display panel including:
a first surface on which a display area is disposed; and
a second surface; and
a digitizer disposed on the second surface of the display panel, wherein the digitizer includes:
a base layer made of an electrically insulative material in which a metal pattern is disposed; and
a blocking layer spaced apart from the metal pattern and disposed on the base layer to block light so as to prevent any underlying pattern from being viewed through a display panel, the blocking layer facing the second surface, wherein
a top surface of the base layer on which the blocking layer is disposed is uneven corresponding to a thickness and arrangement of the metal pattern, the top surface being a main surface of the base layer facing toward the blocking layer, and
the blocking layer includes a surface facing the base layer that is uneven corresponding to the thickness and arrangement of the metal pattern in the base layer.

10. The display apparatus of claim 9, wherein the blocking layer includes at least one of polyimide and a black filler.

11. The display apparatus of claim 9, wherein the digitizer includes a base planarization layer disposed between the base layer and the blocking layer.

12. The display apparatus of claim 9, wherein the base layer includes:
a body layer; and
a pattern layer disposed on the body layer, the blocking layer being disposed on the pattern layer.

13. The display apparatus of claim 12, wherein the base layer includes an adhesive layer disposed between the pattern layer and the blocking layer.

14. The display apparatus of claim 9, further comprising an optical functional layer disposed on the first surface.

15. The display apparatus of claim 9, further comprising a heat-dissipating plate extended to the digitizer.

16. The display apparatus of claim 15, wherein the heat-dissipating plate is bendable.

17. The display apparatus of claim 15, wherein the heat-dissipating plate includes:
a first heat-dissipating plate extended to the digitizer; and
a second heat-dissipating plate extended to the first heat-dissipating plate.

18. The display apparatus of claim 9, wherein the display panel is flexible.

19. The display apparatus of claim 9, wherein a side of the digitizer facing the second surface is substantially flat.

20. A display apparatus comprising:
a display panel to display an image, the display panel including:
a substrate having a first surface on which a display area is disposed and from which the image is viewable by a user and a second surface opposite the first surface; and
a display layer on the first surface;
a panel protecting member disposed on the second surface; and
a digitizer disposed on a surface of the panel protecting member facing away from the display panel and including a base layer made of an electrically insulative material and having an uneven top surface facing the second surface, a contour of the uneven top surface corresponding to a thickness and arrangement of a metal pattern disposed in the base layer, wherein
the blocking layer includes a surface facing the base layer that is uneven corresponding to the thickness and arrangement of the metal pattern in the base layer.

21. The display apparatus of claim 20, further comprising an optical functional layer disposed on the first surface.

22. The display apparatus of claim 20, further comprising a cover member disposed on the first surface.

23. The display apparatus of claim 20, wherein the digitizer includes:
a base layer; and
a blocking layer disposed on the base layer and facing the second surface, the blocking layer to block light so as to prevent the metal pattern from being viewed through the display panel, wherein
the blocking layer is spaced apart from the metal pattern.

24. The display apparatus of claim 23, wherein the blocking layer includes at least one of polyimide and a black filler.

25. The display apparatus of claim 23, wherein the digitizer includes a base planarization layer disposed between the base layer and the blocking layer.

26. The display apparatus of claim 23, wherein the base layer includes:
a body layer; and
a pattern layer disposed on the body layer, the blocking layer being disposed on the pattern layer to prevent the pattern layer from being viewed through a display panel.

27. The display apparatus of claim 26, wherein the base layer includes an adhesive layer disposed between the pattern layer and the blocking layer.

28. The display apparatus of claim 26, further comprising a heat-dissipating plate extended to the digitizer.

29. The display apparatus of claim 28, wherein the heat-dissipating plate is bendable.

30. The display apparatus of claim 28, wherein the heat-dissipating plate includes:
a first heat-dissipating plate extended to the digitizer; and
a second heat-dissipating plate extended to the first heat-dissipating plate.

31. The display apparatus of claim 23, wherein the display panel is flexible.

32. The display apparatus of claim 23, wherein one side of the digitizer facing the second surface is substantially flat.

33. The display apparatus of claim 1, wherein the metal pattern is used as part of a resistive or a capacitive digitizer.

34. The display apparatus of claim 1, wherein the blocking layer is disposed between the metal pattern and the display panel.

* * * * *